United States Patent
Siemieniec et al.

(10) Patent No.: US 9,799,738 B2
(45) Date of Patent: Oct. 24, 2017

(54) SEMICONDUCTOR DEVICE WITH FIELD ELECTRODE AND CONTACT STRUCTURE

(71) Applicant: Infineon Technologies Austria AG, Villach (AT)

(72) Inventors: Ralf Siemieniec, Villach (AT); Oliver Blank, Villach (AT); Michael Hutzler, Villach (AT); David Laforet, Villach (AT); Cedric Ouvrard, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/821,636

(22) Filed: Aug. 7, 2015

(65) Prior Publication Data

US 2016/0064496 A1    Mar. 3, 2016

(30) Foreign Application Priority Data

Aug. 27, 2014   (DE) .......................... 10 2014 112 322

(51) Int. Cl.
| | |
|---|---|
| *H01L 29/40* | (2006.01) |
| *H01L 29/78* | (2006.01) |
| *H01L 29/739* | (2006.01) |
| *H01L 29/06* | (2006.01) |
| *H01L 29/417* | (2006.01) |
| *H01L 29/423* | (2006.01) |

(52) U.S. Cl.
CPC ........ *H01L 29/407* (2013.01); *H01L 29/0696* (2013.01); *H01L 29/41766* (2013.01); *H01L 29/4238* (2013.01); *H01L 29/7397* (2013.01); *H01L 29/7813* (2013.01)

(58) Field of Classification Search
CPC .......................... H01L 29/407; H01L 29/0696; H01L 29/4238

See application file for complete search history.

(56) References Cited

U.S. PATENT DOCUMENTS

| | | | |
|---|---|---|---|
| 2005/0167749 A1 | 8/2005 | Disney | |
| 2008/0265315 A1* | 10/2008 | Mauder | H01L 29/1095 257/330 |
| 2009/0140327 A1* | 6/2009 | Hirao | H01L 29/407 257/328 |

\* cited by examiner

*Primary Examiner* — Amar Movva
(74) *Attorney, Agent, or Firm* — Murphy, Bilak & Homiller, PLLC

(57) ABSTRACT

A semiconductor device includes a field electrode structure with a field electrode and a field dielectric surrounding the field electrode. A semiconductor body includes a transistor section surrounding the field electrode structure and including a source zone, a first drift zone section and a body zone separating the source zone and the first drift zone section. The body zone forms a first pn junction with the source zone and a second pn junction with the first drift zone section. A gate structure surrounds the field electrode structure and includes a gate electrode and a gate dielectric separating the gate electrode and the body zone. A contact structure directly adjoins the source and body zones and surrounds the field electrode structure equably with respect to the field electrode structure.

16 Claims, 14 Drawing Sheets

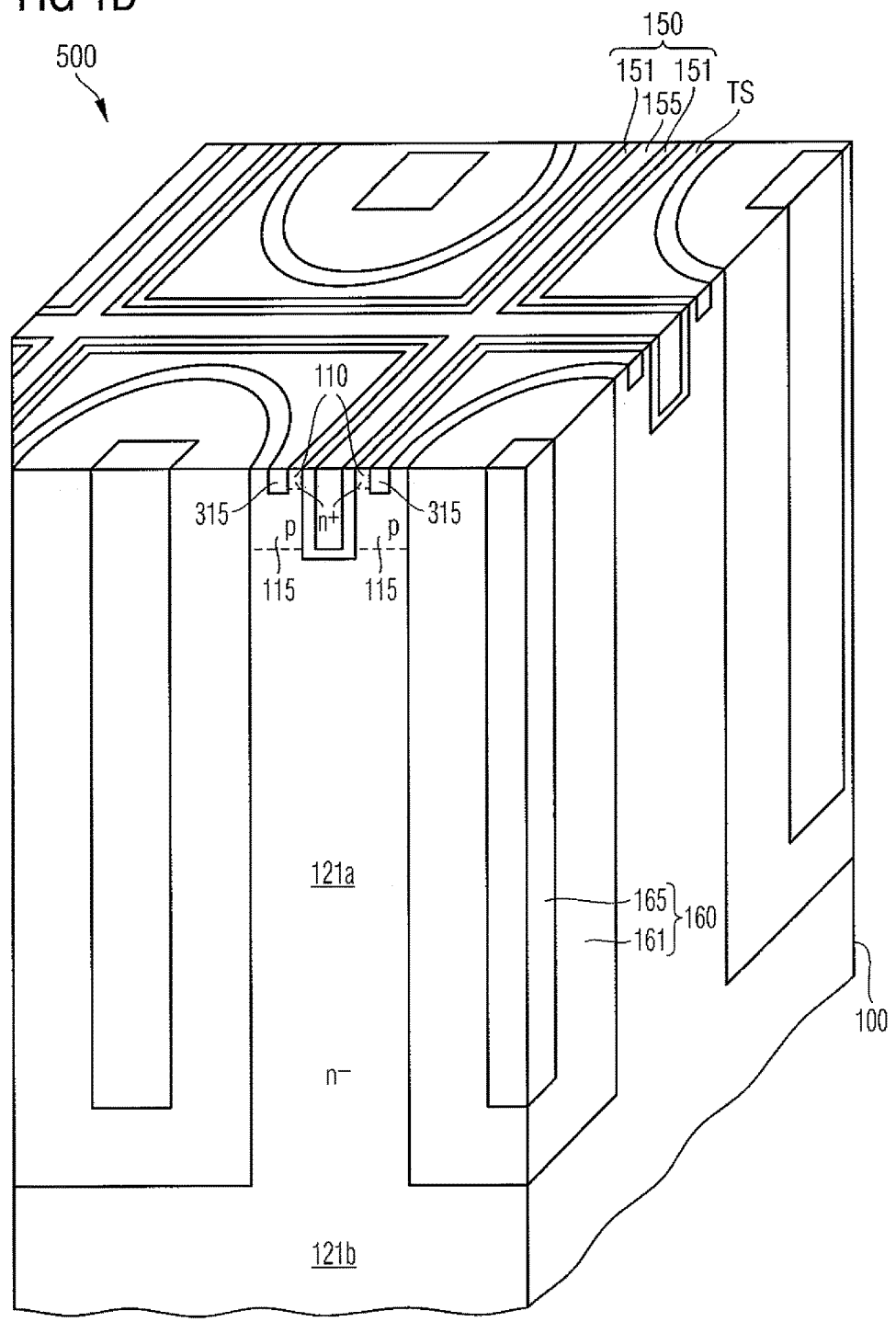

SEMICONDUCTOR DEVICE WITH FIELD ELECTRODE AND CONTACT STRUCTURE

BACKGROUND

The present application claims priority under 35 USC §119 to German (DE) Patent Application Serial No. DE 10 2014 112 322.0 filed on Aug. 27, 2014. The disclosure in this priority application is hereby incorporated fully by reference into the present application.

BACKGROUND ART

Power semiconductor devices such as IGFETs (insulated gate field effect transistors) and IGBTs (insulated gate bipolar transistors) are typically vertical devices with a load current flow between a first surface at a front side of a semiconductor die and a second surface at a rear side. In a blocking mode, stripe-shaped compensation structures extending from the front side into the semiconductor die deplete a drift zone in the semiconductor die. The compensation structures allow higher dopant concentrations in the drift zone without adverse impact on the blocking capabilities. Higher dopant concentrations in turn reduce the on state resistance of the device.

It is desirable to provide semiconductor devices with reduced switching losses.

SUMMARY

According to an embodiment a semiconductor device includes a field electrode structure including a field electrode and a field dielectric surrounding the field electrode. A transistor section of a semiconductor body surrounds the field electrode structure and includes a source zone, a first drift zone section and a body zone separating the source zone and the first drift zone section. The body zone forms a first pn junction with the source zone and a second pn junction with the first drift zone section. A gate structure surrounds the field electrode structure and includes a gate electrode and a gate dielectric separating the gate electrode and the body zone. A contact structure directly adjoins the source and body zones and surrounds the field electrode structure equably with respect to the field electrode structure.

According to another embodiment a semiconductor device includes a field electrode structure with a field electrode and a field dielectric surrounding the field electrode. A semiconductor body includes a transistor section surrounding a plurality of field electrode structures and including a source zone, a first drift zone section and a body zone separating the source zone and the first drift zone section. The body zone forms a first pn junction with the source zone and a second pn junction with the first drift zone section. A gate structure directly adjoins the transistor section on opposing sides and includes a gate electrode and a gate dielectric separating the gate electrode and the body zone. A stripe-shaped contact structure directly adjoins the source and body zones. An ancillary contact structure directly adjoins the field electrode and equably overlaps with the transistor section around the field electrode structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1D is a schematic perspective view of the semiconductor device portion of FIG. 1A.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
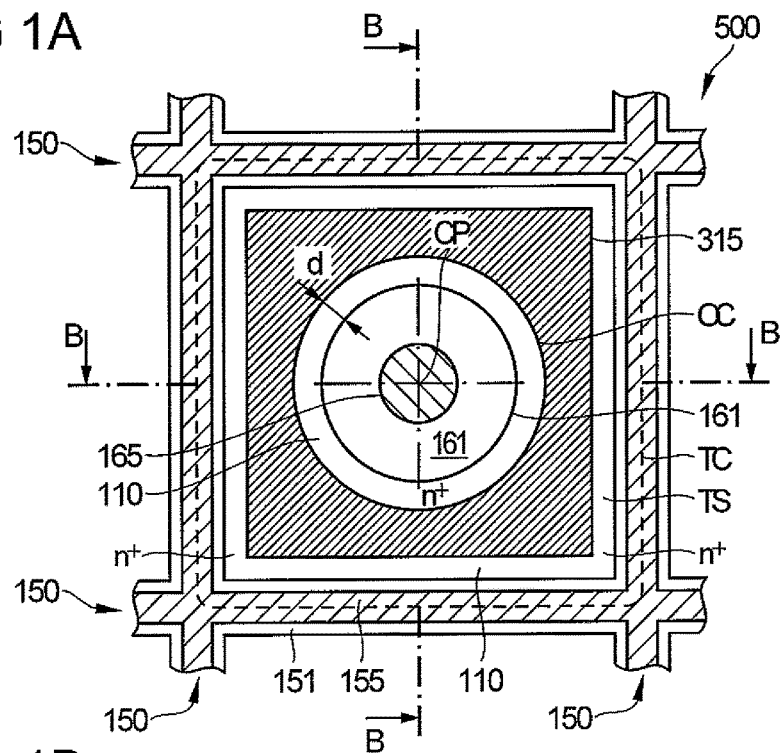
FIG. 1A is a schematic horizontal cross-sectional view of a portion of a semiconductor device according to an embodiment related to a contact structure with a concentric circular opening.
Figure 1B:
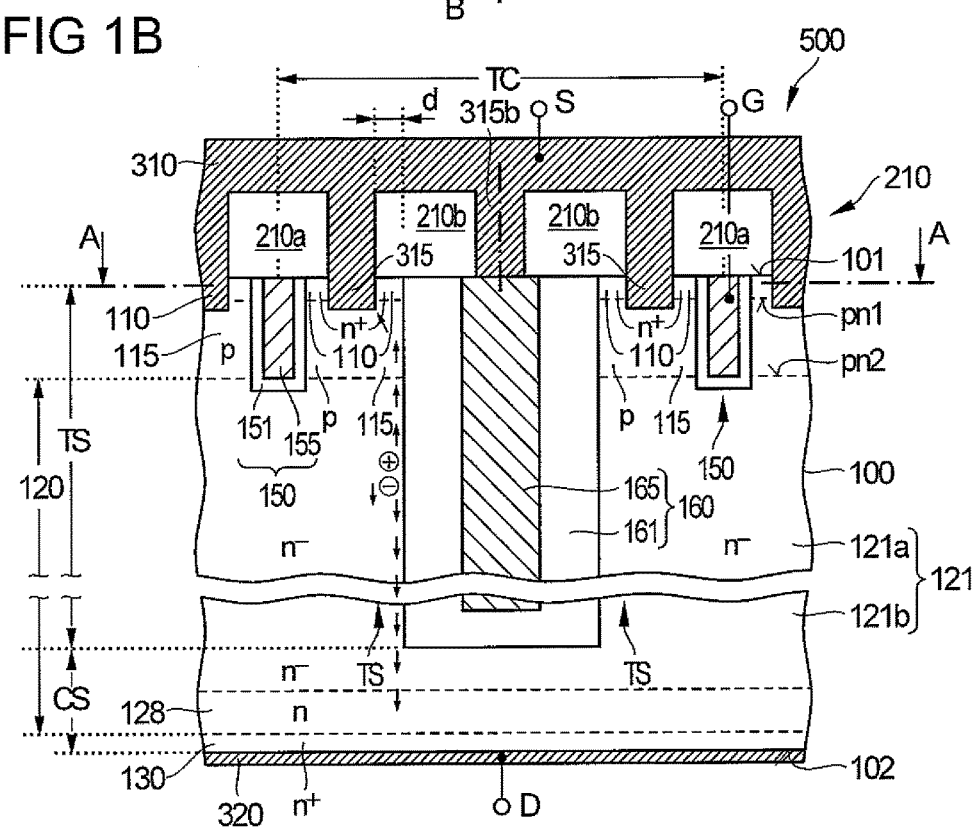
FIG. 1B is a schematic vertical cross-sectional view of the semiconductor device portion of FIG. 1A along line B-B.

FIGS. 1A and 1B refer to a semiconductor device 500 including transistor cells TC. The semiconductor device 500 may be or may include an IGFET, for example an MOSFET (metal oxide semiconductor FET) in the usual meaning including FETs with metal gates as well as FETs with non-metal gates, by way of example. According to another embodiment, the semiconductor device 500 may be an IGBT.

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections as well as a planar second surface 102 parallel to the first surface 101. A distance between the first and second surfaces 101, 102 is selected to achieve a specified voltage blocking capability and may be at least 20 μm. According to other embodiments, the distance may be in the range of several hundred μm. A lateral surface, which is tilted to the first and second surfaces 101, 102 connects the first and second surfaces 101, 102.

In a plane perpendicular to the cross-sectional plane the semiconductor body 100 may have a rectangular shape with an edge length of several millimeters. A normal to the first surface 101 defines a vertical direction and directions orthogonal to the vertical direction are horizontal directions.

The semiconductor body 100 includes a drain structure 120 of a first conductivity type as well as a contact portion 130 of the first conductivity type between the drain structure 120 and the second surface 102. The contact portion 130 may be or may include a substrate portion and/or a heavily doped layer. The drain structure 120 includes a drift zone 121, wherein a dopant concentration in the drift zone 121 may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between 1E15 cm$^{-3}$ and 1E17 cm$^{-3}$, for example in a range from 5E15 cm$^{-3}$ to 5E16 cm$^{-3}$. The drain structure 120 may include further doped zones, for example a field stop layer 128 that separates the drift zone 121 from the contact portion 130. A mean dopant concentration in the field stop layer 128 may be at least five times as high as a mean impurity concentration in the drift zone 121 and at most one-fifth of a maximum dopant concentration in the contact portion 130.

Along the second surface 102 a dopant concentration in the contact portion 130 is sufficiently high to form an ohmic contact with a metal directly adjoining the second surface 102. In case the semiconductor body 100 is based on silicon, in an n-conductive contact portion 130 the dopant concentration along the second surface 102 may be at least 1E18 cm$^{-3}$, for example at least 5E19 cm$^{-3}$. In a p-conductive contact portion 130, the dopant concentration may be at least 1E16 cm$^{-3}$, for example at least 5E17 cm$^{-3}$.

A field electrode structure 160 including a conductive spicular or needle-shaped field electrode 165 and a field dielectric 161 surrounding the field electrode 165 extends from the first surface 101 into the semiconductor body 100. The field electrode 165 includes or consists of a heavily doped polycrystalline silicon layer and/or a metal-containing layer.

The field dielectric 161 separates the field electrode structure 165 from the surrounding semiconductor material of the semiconductor body 100. The field dielectric 161 may include or may consist of a semiconductor oxide, for example thermally grown or deposited silicon oxide, semiconductor nitride, for example deposited or thermally grown silicon nitride, a semiconductor oxynitride, for example silicon oxynitride or a combination thereof. The field dielectric 161 may be a conformal layer, wherein a thickness of the field dielectric 161 may be uniform along the complete circumference of the field electrode 165 and along the complete interface with the field electrode 165.

A vertical extension of the field electrode structure 160 may be smaller than a distance between the first surface 101 and the field stop layer 128 such that a contiguous drift zone section 121b is formed between the field electrode structures 160 and the field stop layer 128. The vertical extension of the field electrode structure 160 may be in a range from 0.2 μm to 45 μm, for example in a range from 2 μm to 20 μm.

A first horizontal extension of the field electrode 165 may be at most three times or twice as large as a second horizontal extension orthogonal to the first horizontal extension. The horizontal extensions may be in a range from 0.1 μm to 2 μm, for example in a range from 0.15 μm to 1 μm.

The horizontal cross-sectional areas of the field electrodes 165 and the field electrode structures 160 may be rectangles or distorted polygons, with or without rounded corners, respectively. According to an embodiment, the first and second horizontal extensions are approximately equal and the horizontal cross-sectional areas of the field electrodes 165 and the field electrode structures 160 are regular polygons such as hexagons or squares, with or without rounded or beveled corners, respectively.

According to other embodiments, horizontal cross-sectional areas of the field electrodes 165 and the field electrode structures 160 may be ellipses or ovals such that the portion of the total cross-sectional area consumed by the field electrode structure 160 can be reduced. Further, the reliability of a field dielectric grown or deposited on an edge may be reduced due to the formation of conductive spikes in portions of the field dielectric covering edges. According to an embodiment, the first and second horizontal extensions are approximately equal and the horizontal cross-sectional areas of the field electrodes 165 and the field electrode structures 160 are circles.

Transistor cells TC are formed centered around a horizontal center point CP of the field electrode structures 160. The transistor cells TC may be arranged matrix-like in lines and rows. According to other embodiments, the transistor cells TC may be arranged in lines, wherein, e.g., odd lines may be shifted with respect to the even lines by half the distance between two transistor cells TC along the line. Semiconducting portions of the transistor cells TC are formed in transistor sections TS of the semiconductor body 100, wherein the transistor sections TS surround the respective field electrode structure 160. The transistor sections TS protrude from a contiguous section CS of the semiconductor body 100.

Each transistor section TS includes a body zone 115 of the second conductivity type, a first drift zone section 121a of the first conductivity type as well as one or more source zones 110 of the first conductivity type.

The first drift zone sections 121a formed between the field electrode structures 160 are directly connected to the contiguous drift zone section 121b formed in the contiguous semiconductor section CS of the semiconductor body 100. In each transistor section TS, the respective body zone 115 forms one or more first pn junctions pn1 with the one or more source zones 110 and a second pn junction pn2 with the first drift zone section 121a.

The source zones 110 may be wells extending from the first surface 101 into the semiconductor body 100, for example into the body zones 115. The body zone 115 of a transistor cell TC completely surrounds the respective field electrode structure 160 in a horizontal plane. According to an embodiment, one source zone 110 surrounds the field electrode structure 160 in a horizontal plane. The source zone(s) 110 may directly adjoin the field electrode structure 160 or may be equally spaced from the field electrode structure 160. According to other embodiments, the field electrode structure 160 of the transistor cell TC is not completely surrounded by one source zone 110 or includes several spatially separated source zones 110.

An outer contour line of a horizontal cross-sectional area of the transistor section TS may be a circle, an ellipse, an oval or a polygon, i.e. a hexagon or a square with or without rounded corners, respectively. An inner contour line of the transistor section TS is defined by the contour of the field electrode structure 160 in the horizontal plane. A horizontal width of the transistor section may be in a range from 0.6 μm to 12 μm, for example in a range from 0.8 μm to 4 μm.

A gate structure 150 includes a conductive gate electrode 155 surrounding the field electrode structure 160 in the horizontal plane within or outside the transistor section TS. According to the illustrated embodiment, the gate structure 150 surrounds the transistor section TS, which in turn surrounds the field electrode structure 160. The gate electrode 155 includes or consists of a heavily doped polycrystalline silicon layer and/or a metal-containing layer.

The gate electrode 155 is completely insulated against the semiconductor body 100, wherein a gate dielectric 151 separates the gate electrode 155 at least from the body zone 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate structure 150 may be a lateral gate formed outside the semiconductor body 100 along the first surface 101. According to the illustrated embodiment the gate structure 150 is a trench gate extending from the first surface 101 into the semiconductor body 100.

In the illustrated embodiments and for the following description, the first conductivity type is n-type and the second conductivity type is p-type. Similar considerations as outlined below apply to embodiments with the first conductivity being p-type and the second conductivity type being n-type.

When a voltage applied to the gate electrode 150 exceeds a preset threshold voltage, electrons accumulate in the channel portions of the body zones 115 directly adjoining the gate dielectric 151 and form inversion channels short-circuiting the second pn junctions pn2 for electrons.

A vertical extension of the gate structures 150 is smaller than the vertical extension of the field electrode structure 160. The vertical extension of the gate structures 150 may be in a range from 200 nm to 2000 nm, for example in a range from 600 nm to 1000 nm.

According to the illustrated embodiment the gate structure 150 surrounds the transistor section TS, such that the field electrode structure 160 and the gate structure 150 sandwich the interjacent transistor section TS with the source and body zones 110, 115. According to other embodiments, the gate structure 150 may be formed between the transistor section TS and the field electrode structure 160.

An interlayer dielectric 210 may be formed on the first surface 101. First dielectric portions 210a of the interlayer dielectric 210 electrically insulate the gate electrodes 155 from a first load electrode 310 provided on the front side. The interlayer dielectric 210 may further include second dielectric portions 210b in the vertical projection of portions of the field electrode structure 160.

The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to a first load terminal, for example the source terminal S. A second load electrode 320, which directly adjoins the second surface 102 and the contact portion 130, may form or may be electrically connected to a second load terminal, which may be the drain terminal D.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the source and body zones 110, 115 of the transistor cells TC. The contact structures 315 may include one or more conductive metal containing layers based on, e.g., titanium (Ti) or tantalum (Ta) and a metal fill portion, e.g., based on tungsten (W). According to other embodiments the contacts structures 315 are heavily doped structures, e.g., heavily n-doped polysilicon or heavily p-doped columnar structures.

Each contact structure 315 equably surrounds the field electrode structure 160 with respect to a center point CP of the transistor cell TC such that a distance d between the respective contact structure 315 and the concerned field electrode structure 160 is the same along the complete circumference of the field electrode structure 160. The distance d may be in a range from 0 to 500 nm, for example from 0 to 250 nm.

According to the embodiments shown in FIGS. 1A to 1D, the contact structure 315 is equally spaced at a distance d>0 from the field electrode structure 160 along the complete circumference of the field electrode structure 160.

When the semiconductor device 500 avalanches, the drain-to-source voltage is clamped to its effective breakdown voltage and electron/hole pairs are generated in the semiconductor body 100 inter alia along the sidewalls of the field electrode structures 160. While the electrons travel to the rear side and are drained off through the second load electrode 320, the holes travel into the direction of the front side along the field electrode structure 160. After passing the second pn junction pn2 the hole current paths get a horizontal component into the direction of the contact structures 315. The horizontal hole current induces a horizontal voltage drop. When the horizontal voltage drop exceeds a base-to-emitter threshold voltage of a parasitic npn bipolar junction transistor (BJT) formed by the n-conductive source region 110, the p-conductive body region 115 and the n-conductive drift zone 121, the parasitic npn BJT may ignite. Ignition of the parasitic BJT may adversely affect device reliability. A horizontal path of the hole current flow of approximately 350 nm may be sufficient to ignite the parasitic BJT. The embodiments avoid long horizontal paths for the hole current flow such that for a given width of the transistor section TS the probability for ignition of the parasitic npn BJT can be reduced. The device operates more reliably.

A horizontal cross-sectional area of the contact structure 315 may have a central opening OC, wherein the contour of the opening OC defines the inner contour of the contact structure 315. The contour of the opening OC and the contour of the field electrode structure 160 are geometrically similar, wherein the contour of the opening OC is obtained by uniformly enlarging the contour of the field electrode structure 160. The cross-sectional area of the opening OC may be greater than the cross-sectional area of the field electrode 165. According to an embodiment, the cross-sectional area of the opening OC is greater than the cross-sectional area of the field electrode structure 160 such that the opening OC exposes a portion of the transistor section TS.

An ancillary contact 315b may electrically connect the field electrode 165 and the first load electrode 310. The ancillary contact 315b may be rotational symmetric and may be formed concentric with regard to the center point CP. Second dielectric portions 210b, which may be formed between the contact structures 315 and the ancillary contact structures 315b, may reduce thermo-mechanical strain.

According to the embodiments illustrated in FIGS. 1A to 1D, the inner contour of the contact structure 315 and the contour of the field electrode structure 160 are circles, wherein the diameter of the opening OC is greater than the diameter of the field electrode structure 160.

The outer contour of the contact structure 315 is concentric with the inner contour and may be a polygon, for example a hexagon or a square with or without rounded or beveled corners, respectively, as illustrated in FIG. 1A such that a width of the contact structure 315 varies as a function of an angular direction at the center point.

Figure 1C:
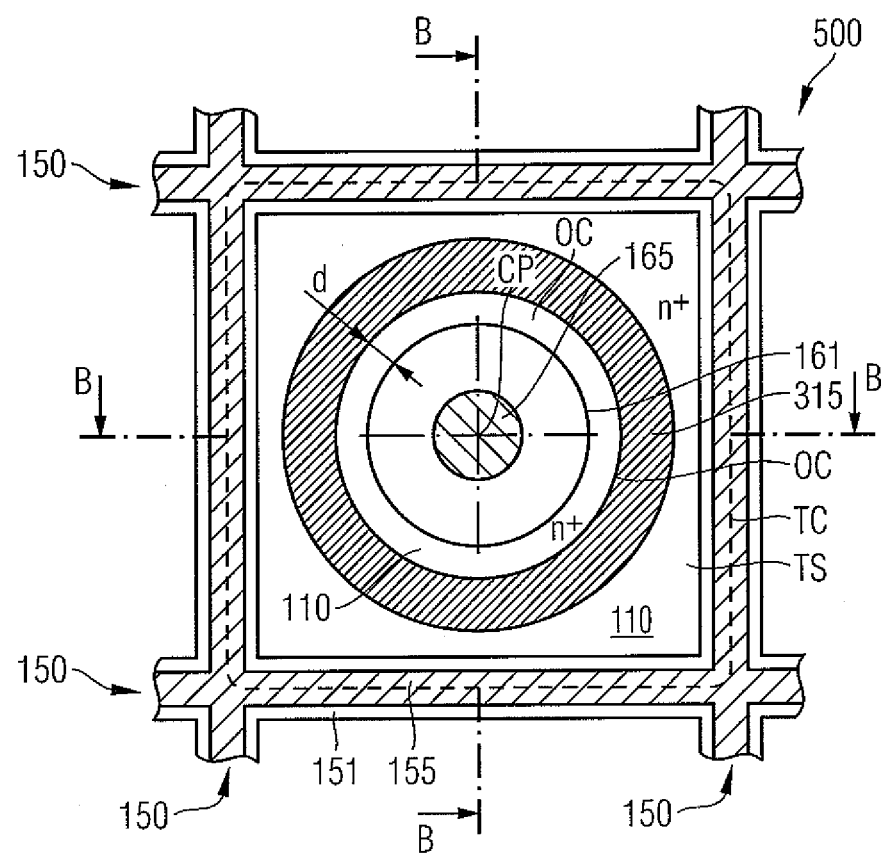
FIG. 1C is a schematic horizontal cross-sectional view of a portion of a semiconductor device according to an embodiment related to a ring-shaped contact structure with a concentric opening.

According to an embodiment illustrated in FIG. 1C the outer contour of the contact structure 315 is a circle.

FIG. 1D is a perspective view of the semiconductor body 100 of the semiconductor device 500 of FIG. 1A. The description of the further embodiments omits the description of elements described in detail with respect to FIGS. 1A to 1D.

Figure 1E:
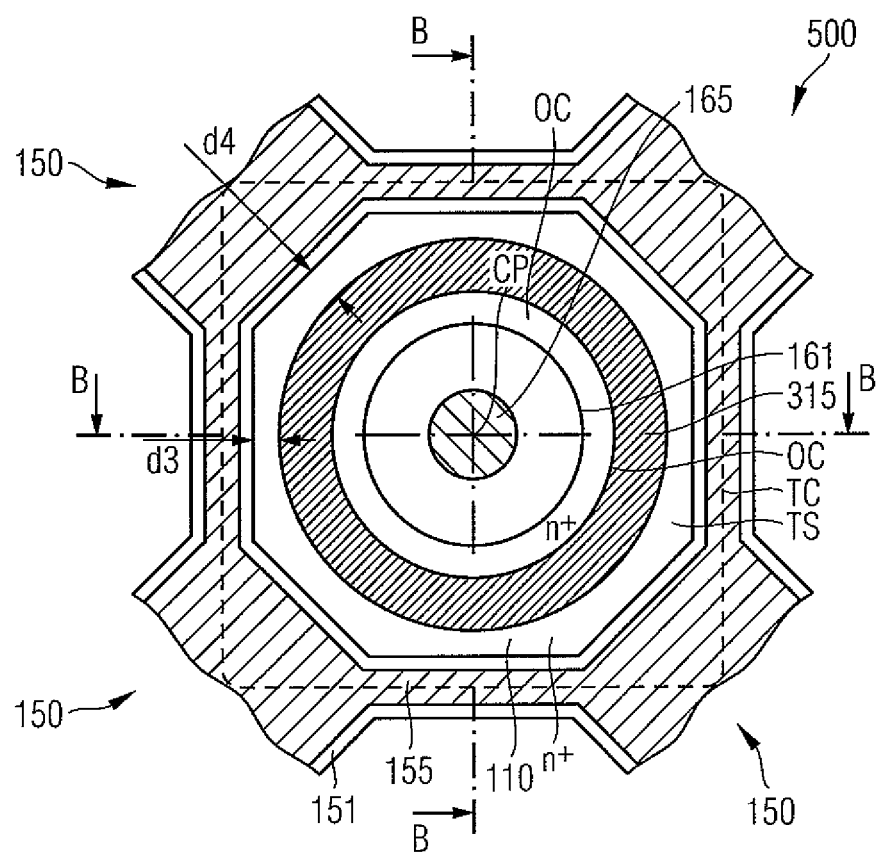
FIG. 1E is a schematic horizontal cross-sectional view of a portion of a semiconductor device according to an embodiment related to a ring-shaped contact structure and a gate structure with chamfered corners.

In FIG. 1E the contact structure 315 is ring-shaped. The gate structure 150 forms a grid with the corners of the meshes being significantly chamfered. For example, a first minimum gate-to-contact distance d3 between the contact structure 315 and straight sections of the gate structure 150 may deviate by not more than 100% from a second minimum gate-to-contact distance d4 between the contact structure 315 and chamfered sections of the gate structure 150.

According to an embodiment, the first and second minimum gate-to-contact distances d3, d4 may deviate from each other by at most 20%. At a sufficient chamfering, a degree of superposition of the effect of two orthogonal straight sections of the gate electrode 155 on a portion of the transistor section TS in the corner between the orthogonal straight sections can be significantly reduced and local variations of the threshold voltage of the transistor cell TC, which are caused by the superposition, can be avoided. According to an embodiment a local threshold voltage varies by not more than 10% along the respective mesh.

Figure 1F:
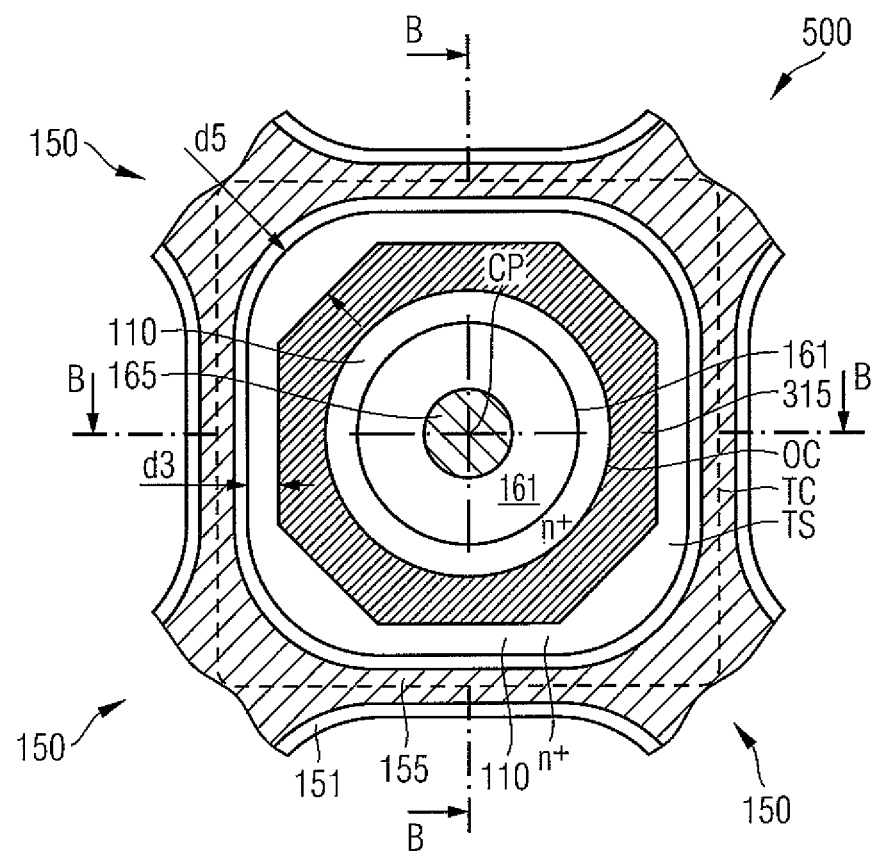
FIG. 1F is a schematic horizontal cross-sectional view of a portion of a semiconductor device according to an embodiment related to a circumferential contact structure with an edged outline and a gate structure with rounded corners.

FIG. 1F shows a circumferential contact structure 315 with an edged outline. Local variations of the threshold voltage of the transistor cell TC may be reduced or avoided by forming the gate structure 150 with the corners of the meshes being significantly rounded. For example, a first minimum gate-to-contact distance d3 between the contact structure 315 and straight sections of the gate structure 150 may deviate by not more than 100% from a maximum gate-to-contact distance d5 between the contact structure 315 and rounded sections of the gate structure 150. According to an embodiment, the first minimum gate-to-contact distance d3 and the maximum gate-to-contact distance d5 may deviate from each other by at most 20%.

Figure 2:
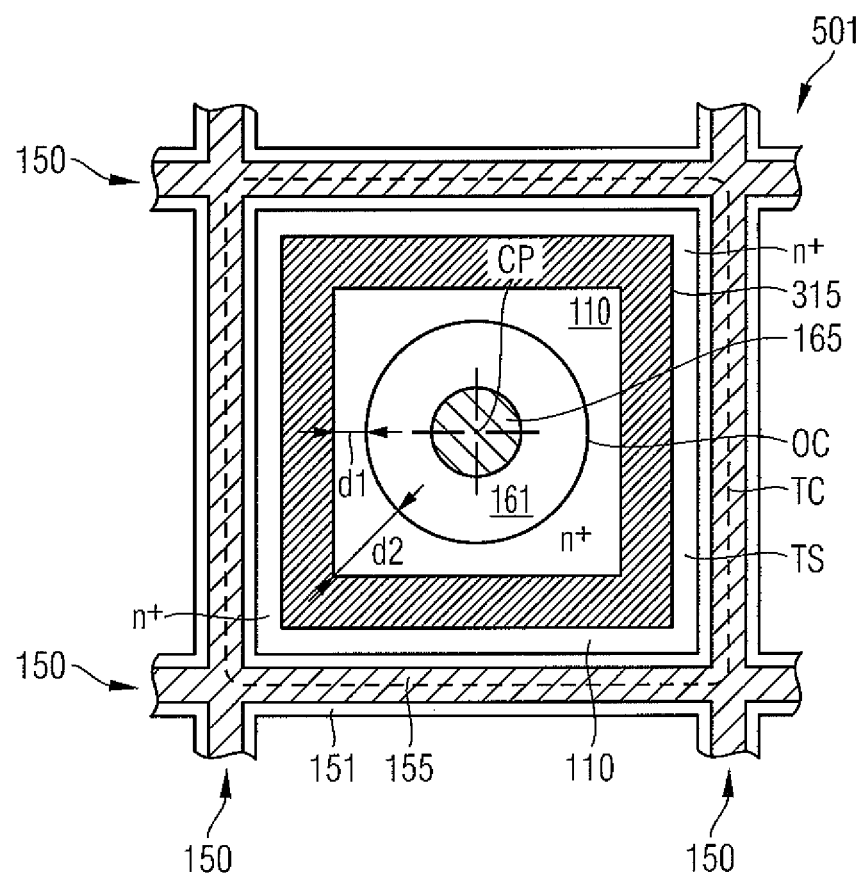
FIG. 2 is a schematic horizontal cross-sectional view of a portion of a reference device including a contact structure with a square opening for discussing effects of the embodiments.

FIG. 2 refers to a reference device 501 with a contact structure 315 having an opening OC which is not geometrically similar to the horizontal cross-sectional area of the field electrode structure 160. Instead, the cross-sectional area of the field dielectric structure 160 is a circle, whereas the opening OC in the contact structure 315 is a square. A distance between the contact structure 315 and the field electrode structure 160 varies between a minimum distance d1 and a maximum distance d2. Along d2, a lateral path length of holes generated in an avalanche mode and traveling along the diagrams of the opening OC may be sufficiently high to generate a sufficient lateral voltage drop to ignite the parasitic BJT. For the same horizontal extensions of the transistor cells TC, the embodiments significantly reduce the maximum distance and lower the risk that the parasitic BJT ignites.

Figure 3A:
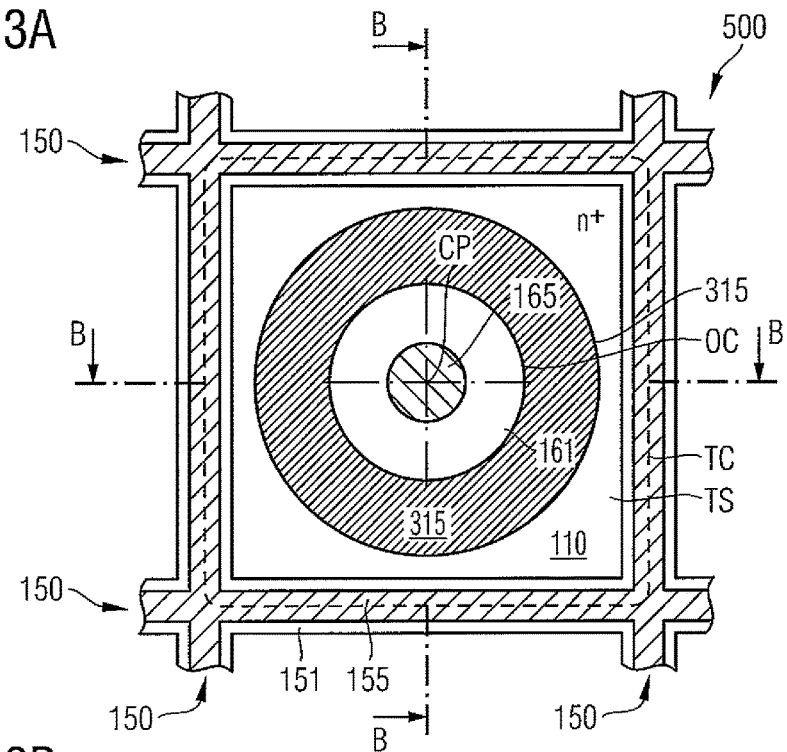
FIG. 3A is a schematic horizontal cross-sectional view of a portion of a semiconductor device in accordance with an embodiment providing a contact structure directly adjoining a field dielectric.
Figure 3B:
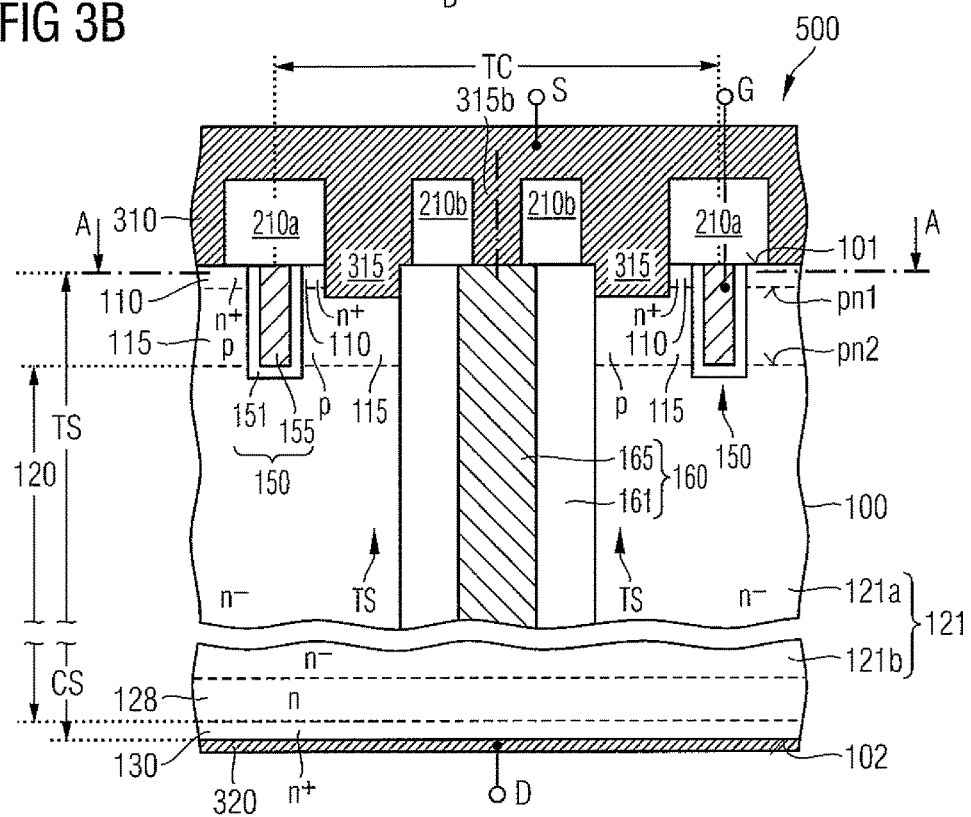
FIG. 3B is a schematic vertical cross-sectional view of the semiconductor device portion of FIG. 3A along line B-B.

FIGS. 3A to 3B refer to a semiconductor device 500 with a contact structure 315 overlapping with the field dielectric 161. The contact structure 315 directly adjoins to the field dielectric 161 in a horizontal plane. Holes generated in the avalanche mode and traveling along the vertical direction along the field electrode structure 160 may directly pass into the first load electrode 310 without any horizontal path component.

Figure 4A:
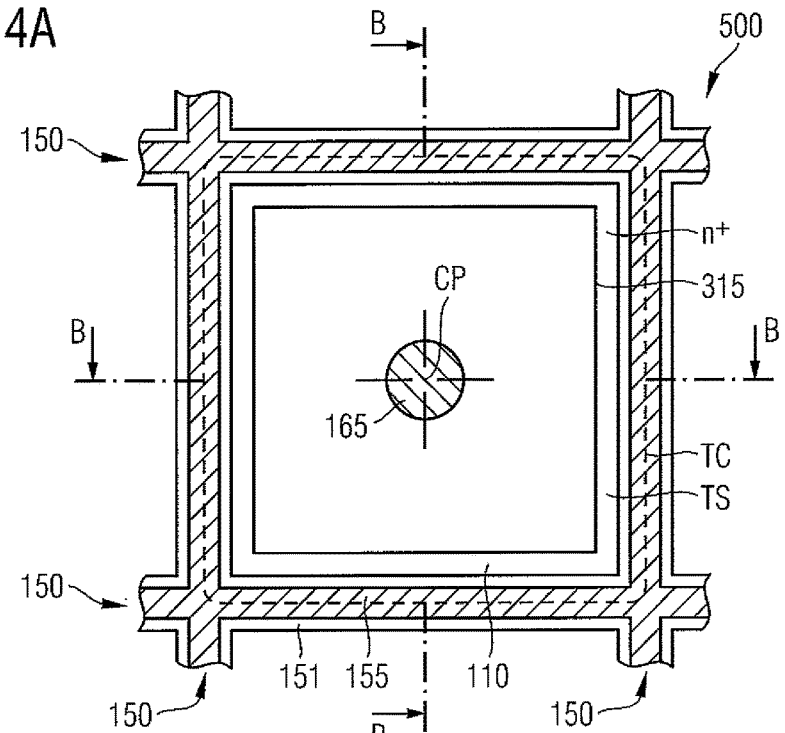
FIG. 4A is a schematic horizontal cross-sectional view of a portion of a semiconductor device in accordance with an embodiment related to a contact structure electrically connecting a field electrode with adjoining source and body regions.
Figure 4B:
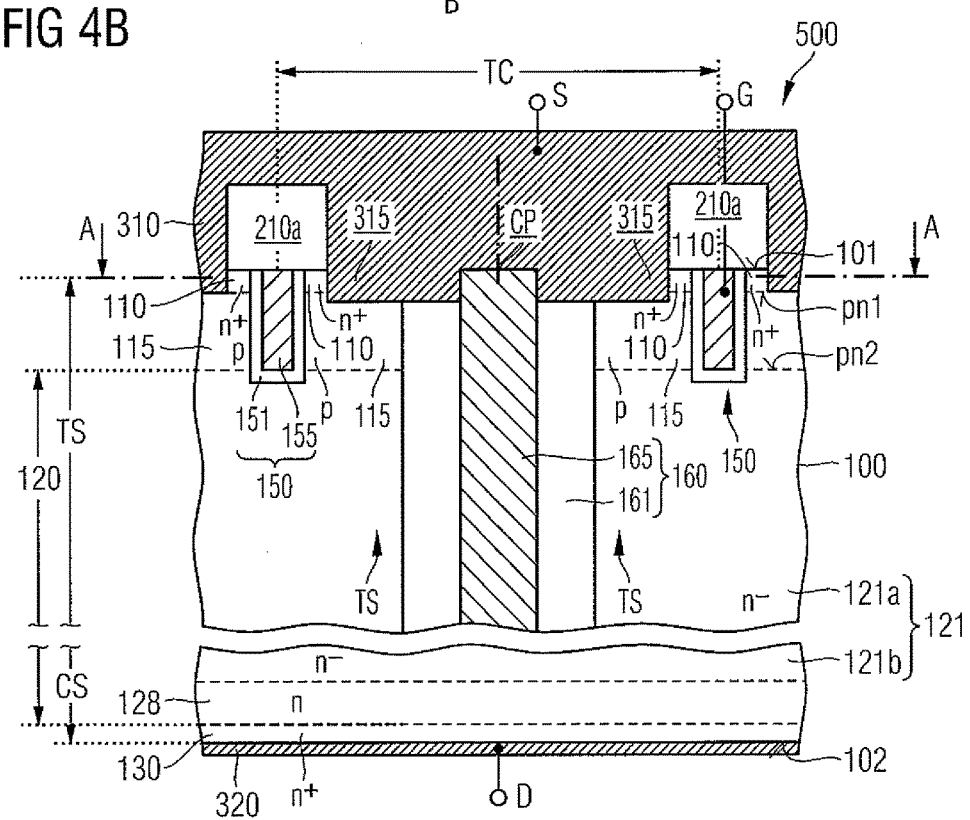
FIG. 4B is a schematic vertical cross-sectional view of the semiconductor device portion of FIG. 4A along line B-B.

In the semiconductor device 500 of FIGS. 4A and 4B one single contact structure 315 electrically connects the source zone 110, the body zone 115, TC and the field electrode 165 of the respective transistor cell with the first load electrode 310. The potential at the field electrode 165 is equal to the potential at the first load electrode 310.

The contact structure 315 may surround a top portion of the field electrode 165 and may directly adjoin the top portion of the field electrode 165 in a horizontal plane as illustrated in FIG. 4B. According to embodiments that are based on an etch process effective on both the material of the semiconductor body 100 and the field electrode 165, the contact structure 315 may surround top portions of the field dielectric 161 on opposite sides.

Figure 5:
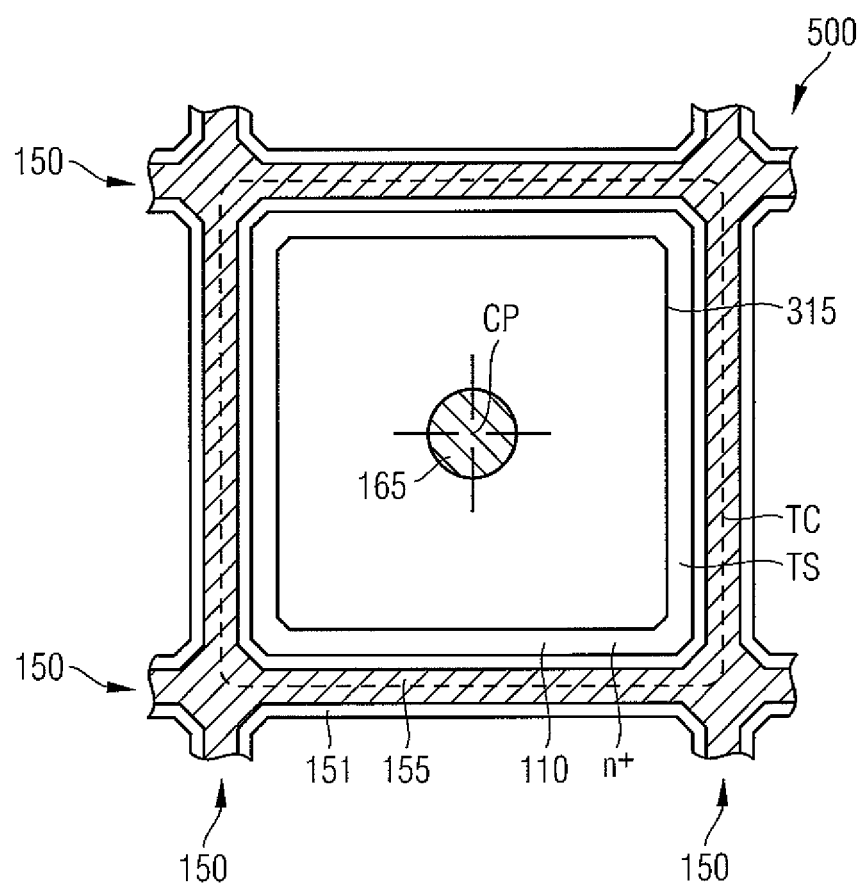
FIG. 5 is a schematic horizontal cross-sectional view of a portion of a semiconductor device in accordance with an embodiment providing transistor sections with beveled edges.

In FIG. 5, the transistor section TS and the contact structure 315 have beveled edges in the horizontal plane such that the contact structure 315 has approximately equal distances to the gate structures 150 along the complete circumference. Independent of the absolute dimensions of the transistor cell TC avalanche ruggedness is further improved, since no elongated lateral paths for a hole current flow exists in the avalanche mode even at the side of the gate structure 150. According to other embodiments, the corners of the transistor sections TS, the contact structure 315 and the gate structure 150 may be rounded such that a distance between the gate structure 150 and the contact structure 315 is equal along the complete circumference of the transistor section TS.

Figure 6:
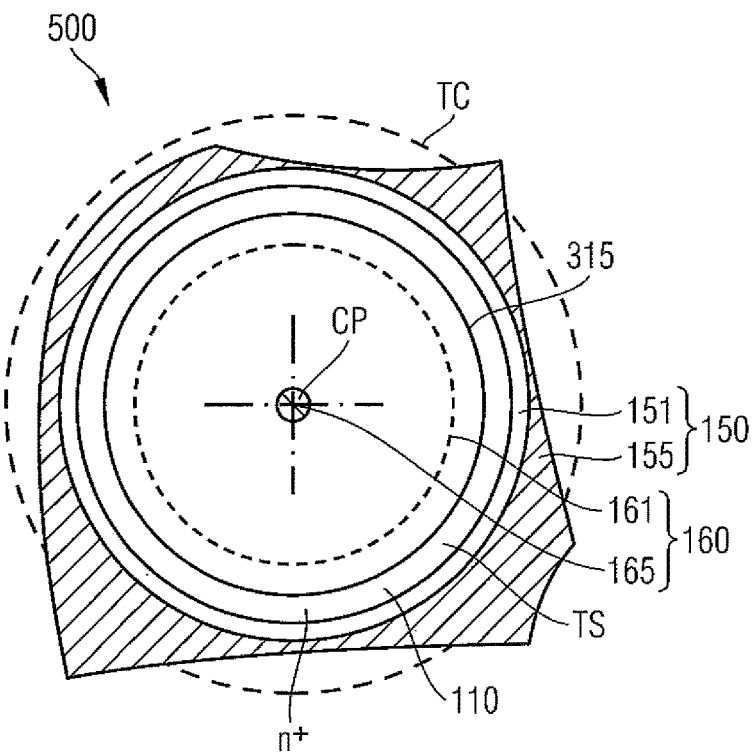
FIG. 6 is a schematic horizontal cross-sectional view of a portion of a semiconductor device in accordance with an embodiment with circular transistor sections.

FIG. 6 refers to a transistor cell TC based on a transistor section TS with a ring-shaped cross-sectional area sandwiched between the field electrode structure 160 and the gate structure 150. The contact structure 315 may directly adjoin the field electrode 165 or may be spaced from the field electrode 165, wherein in the latter case the contact structure 315 may or may not overlap with the field dielectric 161. A vertical cross-section is equivalent to that shown in FIG. 4B.

The transistor cells TC as illustrated in FIG. 6 may be arranged in a matrix structure with regularly spaced parallel lines and rows.

Figure 7:
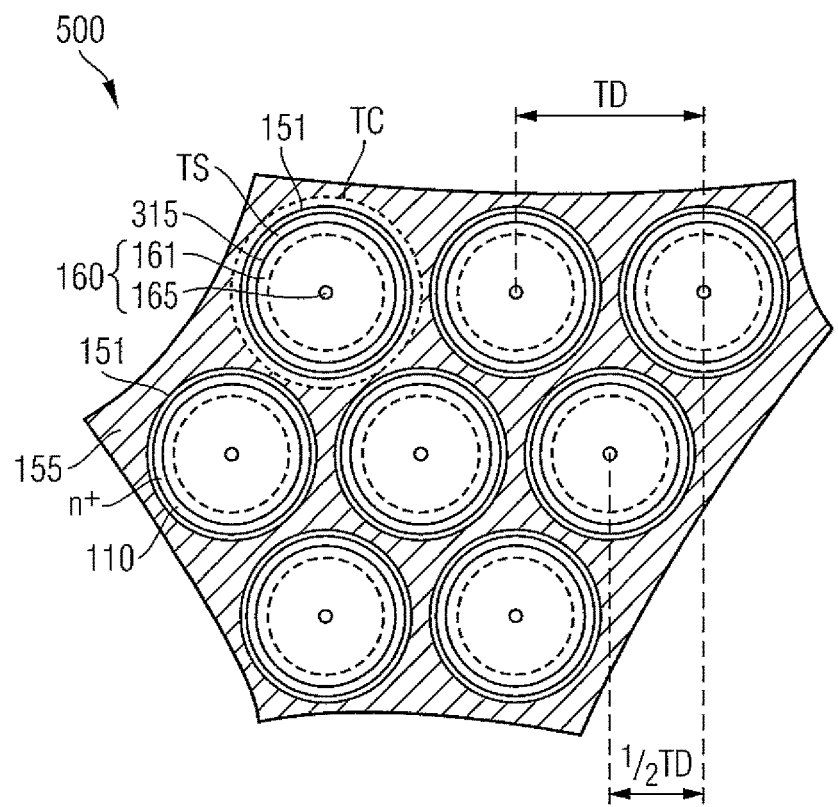
FIG. 7 is a schematic layout of circular transistor cells as illustrated in FIG. 6 according to an embodiment.

FIG. 7 refers to an embodiment with transistor cell TC as illustrated in FIG. 6 arranged in shifted lines, wherein adjoining lines are shifted to each other by the half TD/2 center-to-center distance TD along the lines. The gate electrodes 155 are connected to each other and form a grid embedding the transistor sections TS of the transistor cells TC. The conformal gate dielectrics 151 with uniform thickness separate the gate electrode grid from the transistor sections TS of the transistor cells TC.

Figure 8A:
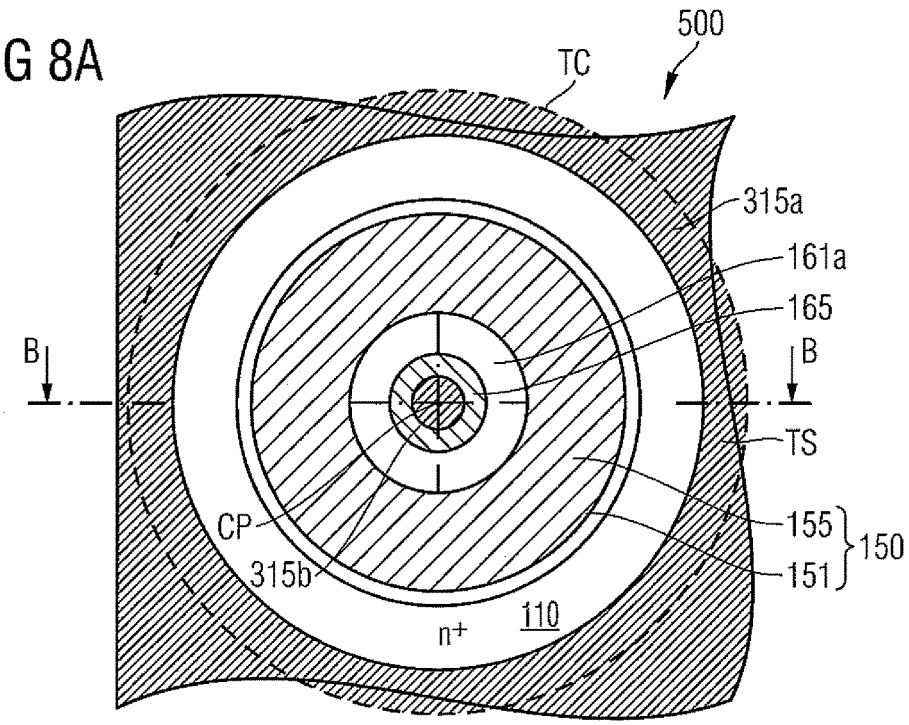
FIG. 8A is a schematic horizontal cross-sectional view of a portion of a semiconductor device according to an embodiment related to ring-shaped gate electrodes formed between the field electrode and the transistor section of the respective transistor cell.
Figure 8B:
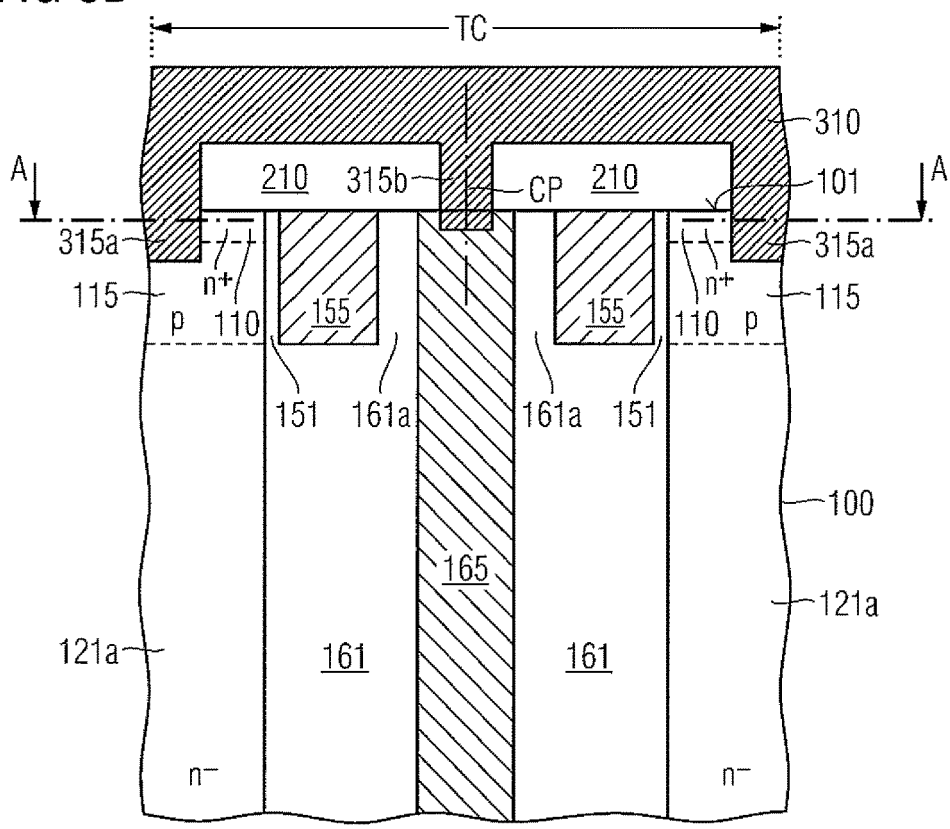
FIG. 8B is a schematic vertical cross-sectional view of the semiconductor device portion of FIG. 8A along line B-B.

In the semiconductor device 500 of FIGS. 8A to 8B, the gate structures 150 are formed between the field electrode structures 160 and the transistor sections TS, respectively. Each gate structure 150 may be formed based on the same trench as provided for the concerned field electrode structure 160, such that an outer contour of the gate structure 150 is formed in the vertical projection of a bottom portion of the field dielectric 161, wherein the bottom portion is oriented to the rear side. The outer contours of the gate structure 160 and the bottom portion of the field electrode structure 160 may be flush.

According to other embodiments, the gate structure 150 may be formed outside a trench on which the adjacent field electrode structure 160 is based. A portion 161a of the field dielectric 161 separates the field and gate electrodes 165, 155. An ancillary contact structure 315b concentric with the transistor cell TC may electrically connect the field electrode 165 with the first load electrode 310. According to other embodiments the interlayer dielectric 210 insulates the first load electrode 310 from the field electrode 165.

Figure 9A:
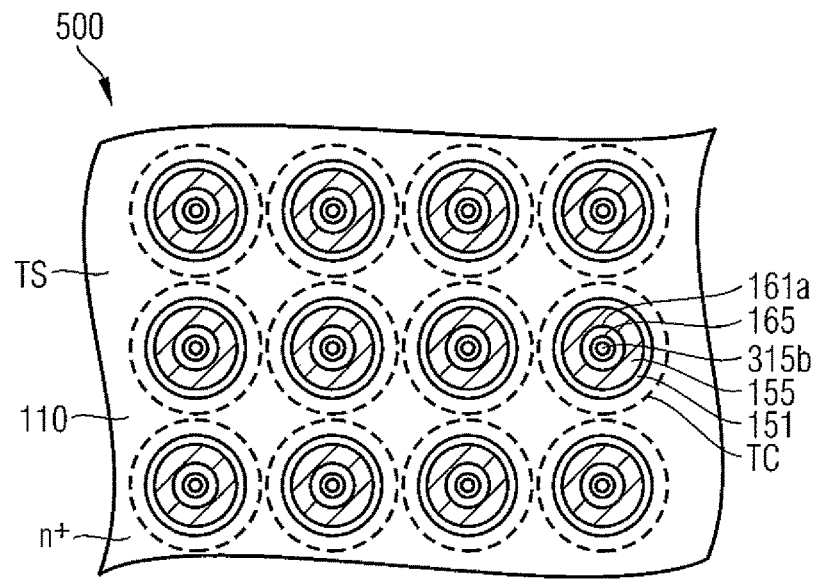
FIG. 9A is a schematic layout of transistor cells as illustrated in FIGS. 8A to 8B according to an embodiment with the transistor cells arranged in a matrix.

The transistor cells TC may be arranged matrix-like in equally spaced parallel lines and rows as illustrated in FIG. 9A.

Figure 9B:
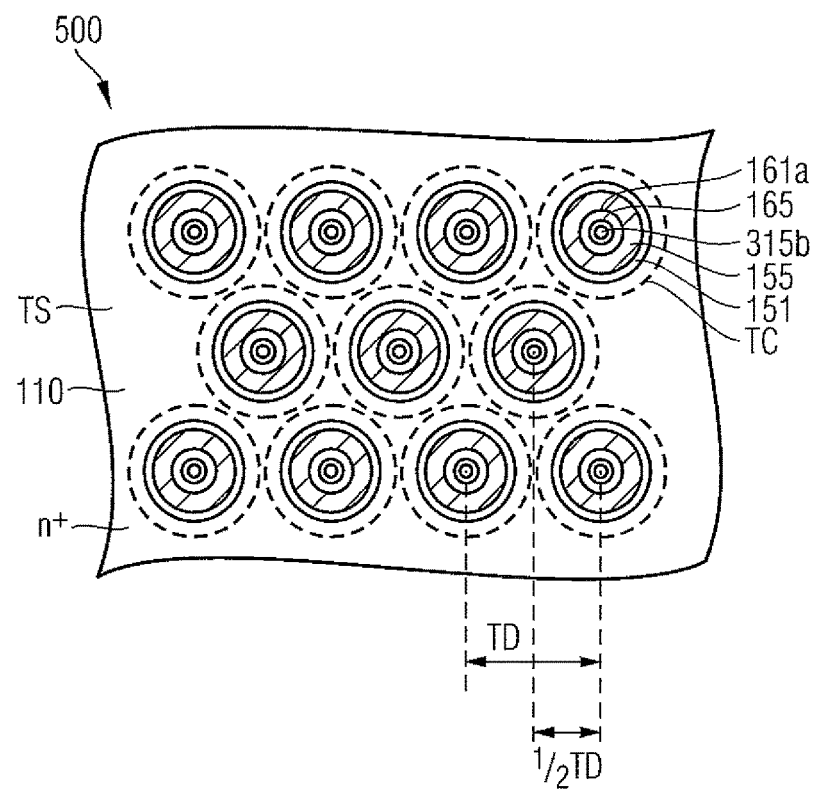
FIG. 9B is a schematic layout of transistor cells as illustrated in FIGS. 8A to 8B according to an embodiment with the transistor cells arranged in staggered lines.

In FIG. 9B the transistor cells TC in odd lines are shifted with respect to that in even lines along the line direction by the half TD/2 center-to-center distance TD between neighboring transistor cells TC along the line.

Figure 10:
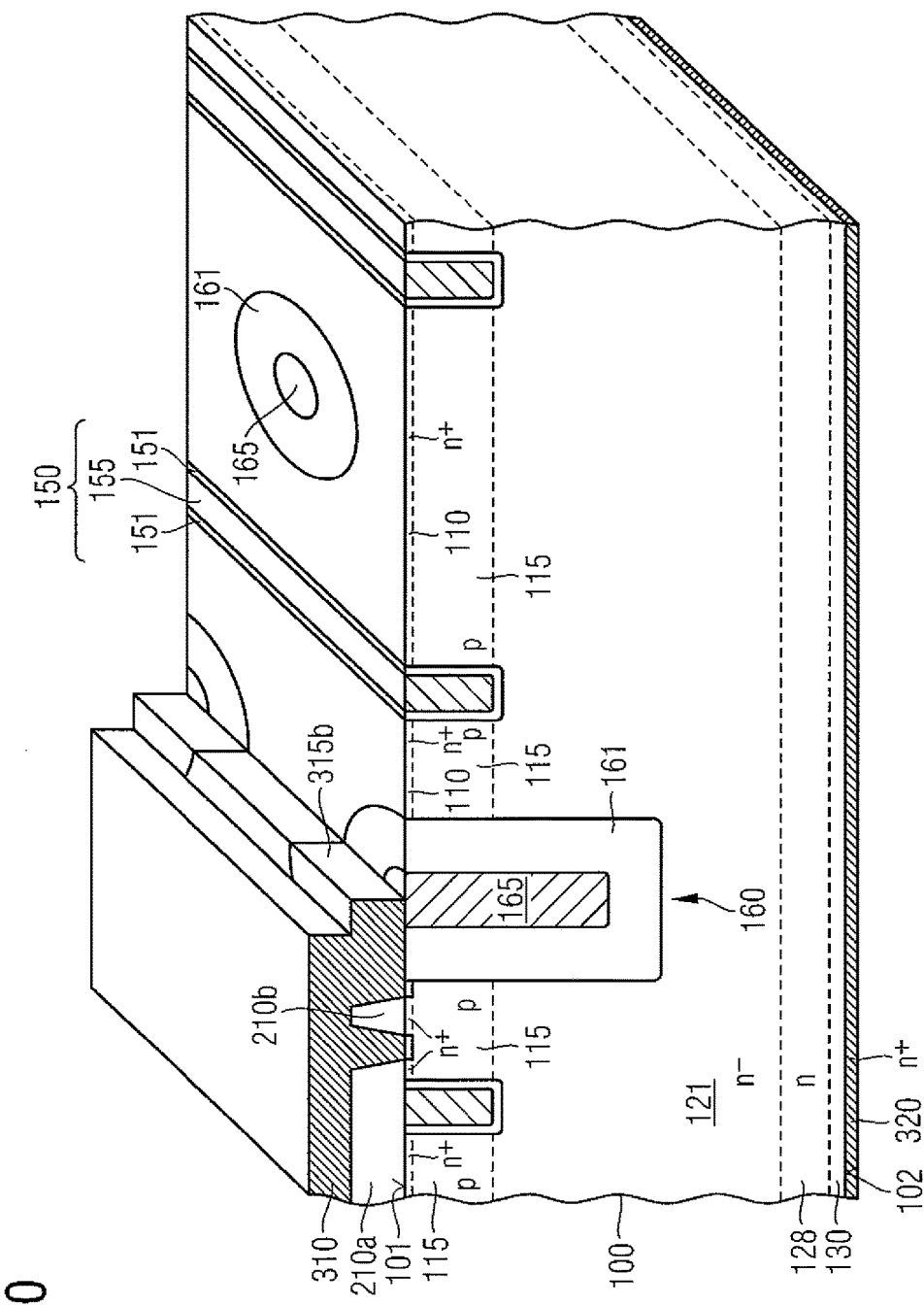
FIG. 10 is a schematic perspective view of a semiconductor device according to an embodiment related to stripe-shaped contact structures connecting spatially separated field electrodes.

The semiconductor device 500 of FIG. 10 combines needle-shaped field electrodes 165 with stripe-shaped contact structures 315 that directly adjoin the source and body zones 110, 115. Ancillary contact structures 315b directly adjoin the field electrodes 165, respectively, and may overlap with the transistor section TS around each field electrode structure 160. According to an embodiment the overlap may be uniform along the whole circumference of the field electrode structure 160. According to another embodiment, the overlap varies as a function of an angular direction. For example, an outer contour of the field electrode structure 160 may be a circle and an outer contour of the ancillary contact structure 115b may be a square. According to other embodiments, each ancillary contact structure 115b includes a first portion surrounding the field electrode structure 160 at a uniform distance and a second portion directly adjoining the field electrode 165, wherein a portion of the interlayer dielectric is formed between the first and second portions, respectively.

Compared to stripe-shaped field electrodes, the spicular or needle-shaped field electrodes 165 of the present embodiments increase the total area of the transistor sections TS in a given semiconductor area and therefore reduce the total on-state resistance of the drift zone and the device RDSon. The contact structures according to the present embodiments significantly increase avalanche ruggedness because the length of the hole current path through the body zones of the transistor cells is kept small and approximately constant for the alignment tolerances of the relevant lithography masks. A distance between the contact structures 315 and the field electrode structures 160 is constant and does not depend on the shape of the cross-sectional area of the needle-shaped field electrodes and on the layout. Needle-shaped field electrodes with circular horizontal cross-sections provide a high ratio of semiconductor area to field electrode area and reliable field dielectrics.

Figure 11:
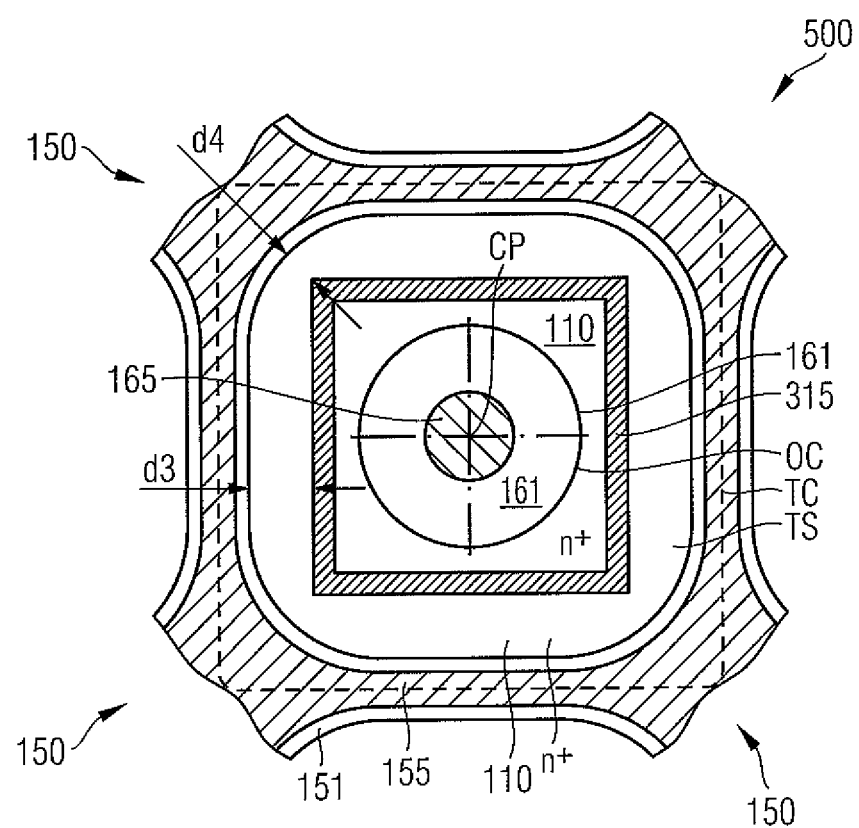
FIG. 11 is a schematic horizontal cross-sectional view of a portion of semiconductor device according to an embodiment related to a contact structure with a square opening and an edged outline as well as a gate structure with rounded corners.

FIG. 11 concerns embodiments with a contact structure 315 having an opening OC which is not geometrically similar to the horizontal cross-sectional area of the field electrode structure 160. The corners of the meshes formed by a grid-shaped gate structure 150 are significantly chamfered or rounded. For example, a first minimum gate-to-contact distance d3 between the contact structure 315 and straight sections of the gate structure 150 may deviate by not more than 100% from a second minimum gate-to-contact distance d4 between the contact structure 315 and chamfered or rounded sections of the gate structure 150.

According to an embodiment, the first and second minimum gate-to-contact distances d3, d4 may deviate from each other by at most 20%. At a sufficient chamfering, a degree of superposition of the effect of two orthogonal straight sections of the gate electrode 155 on a portion of the transistor section TS in the corner between the orthogonal straight sections can be significantly reduced and local variations of the threshold voltage of the transistor cell TC, which are caused by the superposition, can be avoided.

The embodiment of FIG. 11 can be combined with the further features described in detail with regard to FIGS. 1A to 1F to obtain a semiconductor device 500 that includes field electrode structures 160 including a field electrode 165 and a field dielectric 161 surrounding the field electrode 165, respectively. A semiconductor body 100 includes transistor sections TS, wherein each transistor section TS surrounds one of the field electrode structures 160 and includes a source zone 110, a first drift zone section 121a and a body zone 115 separating the source zone 110 and the first drift zone section 121a. The body zone 115 forms a first pn junction pn1 with the source zone 110 and a second pn junction pn2 with the first drift zone section 121a.

A gate structure 150 forms a grid with the field electrode structures 160 arranged in meshes of the grid. The gate structure 150 includes a gate electrode 155 and a gate dielectric 151 separating the gate electrode 155 and the body zone 115. Contact structures 315 directly adjoin the source and body zones 110, 115 and surround the field electrode structure 160 at uniform distance or at locally varying distances. Corners of the gate structure 150 are rounded or chamfered such that along the respective mesh a local threshold voltage varies by not more than 10%.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising:
a field electrode structure comprising a field electrode and a field dielectric surrounding the field electrode;
a semiconductor body including a transistor section surrounding the field electrode structure in a horizontal plane parallel with and below a first surface of the semiconductor body, the semiconductor body comprising a source zone, a first drift zone section and a body zone separating the source zone and the first drift zone section, the body zone forming a first pn junction with the source zone and a second pn junction with the first drift zone section;
a gate structure surrounding the field electrode structure in the same horizontal plane as the transistor section and comprising a gate electrode and a gate dielectric separating the gate electrode and the body zone; and
a contact structure adjoining the source and body zones and surrounding the field electrode structure in the same horizontal plane as the transistor section and the gate structure.

2. The semiconductor device of claim 1, wherein the field electrode extends substantially perpendicular to the horizontal plane.

3. The semiconductor device of claim 1, wherein a first extension of the field electrode is at most twice as large as a second extension orthogonal to the first extension.

4. The semiconductor device of claim 1, wherein a cross-sectional area of the field electrode is a circle.

5. The semiconductor device of claim 1, wherein a cross-sectional area of the contact structure has a concentric opening and a cross-sectional area of the opening and a cross-sectional area of the field electrode structure are geometrically similar.

6. The semiconductor device of claim 1, wherein a cross-sectional area of the contact structure and a cross-sectional area of the transistor section are geometrically similar.

7. The semiconductor device of claim 1, wherein a cross-sectional area of the contact structure is a ring.

8. The semiconductor device of claim 1, wherein in the horizontal plane the contact structure surrounds the field electrode structure at a constant distance.

9. The semiconductor device of claim 1, wherein a width of the contact structure varies as a function of an angular direction at a center point of the field electrode.

10. The semiconductor device of claim 1, wherein the contact structure directly adjoins the field electrode structure.

11. The semiconductor device of claim 1, wherein in the horizontal plane the source zone is sandwiched between the field electrode structure and the gate structure.

12. The semiconductor device of claim 1, wherein gate structures of a plurality of transistor cells form a grid embedding transistor sections of the transistor cells.

13. The semiconductor device of claim 1, wherein in a plane parallel to a first surface the gate electrode is formed between the field electrode and the transistor section.

14. The semiconductor device of claim 1, wherein transistor sections of a plurality of transistor cells form a grid embedding gate structures and field electrode structures of the transistor cells.

15. The semiconductor device of claim 1, wherein a portion of the field dielectric separates the field electrode and the gate electrode.

16. The semiconductor device of claim 1, wherein an inner contour of the gate electrode is a circle.

* * * * *